United States Patent
Qu et al.

(10) Patent No.: US 11,495,147 B2
(45) Date of Patent: Nov. 8, 2022

(54) DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Bowen Qu, Beijing (CN); Dongling Sun, Beijing (CN); Haitao Wang, Beijing (CN); Juncai Ma, Beijing (CN); Hongqiao Xu, Beijing (CN); Jinbo Xu, Beijing (CN)

(73) Assignees: HEFEI BOE OPTOELECTRONICS TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 271 days.

(21) Appl. No.: 16/641,434

(22) PCT Filed: May 30, 2019

(86) PCT No.: PCT/CN2019/089334
§ 371 (c)(1),
(2) Date: Feb. 24, 2020

(87) PCT Pub. No.: WO2019/228469
PCT Pub. Date: Dec. 5, 2019

(65) Prior Publication Data
US 2020/0202753 A1    Jun. 25, 2020

(30) Foreign Application Priority Data
May 31, 2018 (CN) .......................... 201810549990.2

(51) Int. Cl.
*G09F 9/30* (2006.01)
*H05K 7/20* (2006.01)

(52) U.S. Cl.
CPC .......... *G09F 9/301* (2013.01); *H05K 7/20972* (2013.01)

(58) Field of Classification Search
CPC ...................................................... G09F 9/301
See application file for complete search history.

(56) References Cited

U.S. PATENT DOCUMENTS 4,794,715 A * 1/1989 Cherwin ................ B60J 1/2019
                                                    40/514
9,743,537 B2 * 8/2017 Kim .......................... H05K 5/02
(Continued)

FOREIGN PATENT DOCUMENTS

CN         1949315 A       4/2007
CN       101689004 A       3/2010
(Continued)

OTHER PUBLICATIONS

Fujiwaraa, "Cleaner For Screens Of TV, PC, CAD, CAM Has Outer Cylindrical Surface Made Of Extra Fine Synthetic Fiber, Intermediate Layer Made Of Mixture Of Paper And Conductive Fiber, Inner Layer Made Of Cushioning Material", Aug. 24, 1999, Abstract (translation of JP 11225940) (Year: 1999).*

(Continued)

*Primary Examiner* — Stephen S Sul
*Assistant Examiner* — Alexander Ryan Horton
(74) *Attorney, Agent, or Firm* — Nath, Goldberg & Meyer; Joshua B. Goldberg (57) ABSTRACT

The present disclosure provides a display device including a display panel, a pair of supporting components, a rotating component, a first fixing part and a second fixing part. The display panel comprises: a first side and a second side which are opposite to each other, and the first side is fixedly connected to the first fixing part, and the second side is fixedly connected to the second fixing part. The pair of (Continued)

supporting components comprises: a first supporting component and a second supporting component which are opposite to each other. A first end of the first supporting component is fixedly connected to a first end of the rotating component, and a second end of the first supporting component is fixedly connected to a first end of the second fixing part at the second side of the display panel.

14 Claims, 5 Drawing Sheets

(56) References Cited

U.S. PATENT DOCUMENTS

| | | | | |
|---|---|---|---|---|
| 9,823,700 | B2* | 11/2017 | Lee | G06F 1/1652 |
| 10,264,687 | B2* | 4/2019 | Choi | H05K 5/0217 |
| 10,426,046 | B2* | 9/2019 | Hayk | H05K 5/0221 |
| 10,701,813 | B2* | 6/2020 | Kim | H02P 3/06 |
| 2014/0347827 | A1* | 11/2014 | Lee | G02F 1/133305 |
| | | | | 361/749 |
| 2016/0187929 | A1* | 6/2016 | Kim | G06F 1/1601 |
| | | | | 345/184 |
| 2017/0060183 | A1* | 3/2017 | Zhang | G06F 1/1605 |
| 2018/0198899 | A1* | 7/2018 | Lee | H04M 1/0266 |
| 2018/0210560 | A1* | 7/2018 | Xia | G06F 3/0221 |
| 2019/0163892 | A1* | 5/2019 | Lin | G06F 21/84 |
| 2019/0324502 | A1* | 10/2019 | Chang | H05K 5/0217 |

FOREIGN PATENT DOCUMENTS

| | | |
|---|---|---|
| CN | 104851366 A | 8/2015 |
| CN | 105096743 A | 11/2015 |
| CN | 106875846 A | 6/2017 |
| CN | 107256679 A | 10/2017 |
| CN | 107316566 A | 11/2017 |
| CN | 107413770 A | 12/2017 |
| CN | 108717828 A | 10/2018 |
| DE | 202008007811 U1 | 10/2008 |
| JP | 11225940 A * | 8/1999 |

OTHER PUBLICATIONS

First Office Action dated Jul. 1, 2019 for corresponding Chinese application 201810549990.2.

Second Office Action dated Jan. 20. 2020 for corresponding Chinese application 201810549990.2.

* cited by examiner

DISPLAY DEVICE

CROSS-REFERENCE TO RELATED APPLICATIONS

This is a National Phase Application filed under 35 U.S.C. 371 as a national stage of PCT/CN2019/089334, filed May 30, 2019, an application claiming the benefit of Chinese Application No. 201810549990.2, filed May 31, 2018, the content of each of which is hereby incorporated by reference in its entirety.

TECHNICAL FIELD

The disclosure relates to the field of display technology, and particularly relates to a display device.

BACKGROUND

A flexible display screen has been widely used due to its characteristics of lower power consumption, lighter weight, easy deformation, no rigidity and the like. If there is a problem with the wrapping of the flexible display screen, it may not only affect service life of the flexible display screen, but also damage display effect of the flexible display screen. Therefore, how to better fold and unfold a flexible display screen has become one of hot research directions.

In the related art, folding or unfolding a flexible display screen is achieved by manually dragging the flexible display screen. When the force applied for manually dragging is uneven, even if in a case that both sides of the flexible display screen each are provided with a frame, wrinkling or even tearing damage still tends to appear for the flexible display screen, thereby influencing the display effect of the flexible display screen.

SUMMARY

The present disclosure provides a display device including: a display panel, a pair of supporting components, a rotating component, a first fixing part and a second fixing part; wherein the first fixing part is fixedly connected to the rotating component; the display panel comprises: a first side and a second side which are opposite to each other, and the first side is fixedly connected to the first fixing part, and the second side is fixedly connected to the second fixing part; the pair of supporting components comprises: a first supporting component and a second supporting component which are opposite to each other; a first end of the first supporting component is fixedly connected to a first end of the rotating component, and a second end of the first supporting component is fixedly connected to a first end of the second fixing part at the second side of the display panel; a first end of the second supporting component is fixedly connected to a second end of the rotating component, and a second end of the second supporting component is fixedly connected to a second end of the second fixing part at the second side of the display panel; and the first supporting component interacts with the second supporting component for supporting the display panel when the display panel is in an unfolded state; and the rotating component is rotated under an external force to drive the display panel, the first supporting component and the second supporting component to move simultaneously, thereby folding or unfolding the display panel.

In some embodiments, an orthographic projection of the first supporting component and an orthographic projection of the second supporting component on a plane parallel to the display panel do not overlap an orthographic projection of the display panel on the plane parallel to the display panel.

In some embodiments, the first side of the display panel is fixedly connected to the first fixing part by upper and lower clamping blocks, the second side of the display panel is fixedly connected to the second fixing part by upper and lower clamping blocks, and the upper and lower clamping blocks corresponding to the second fixing part are fastened by a fastening bolt.

In some embodiments, the rotating component includes: a rotating shaft and a sleeve; wherein the first end of the first supporting component is fixedly connected to a first end of the sleeve; the first end of the second supporting component is fixedly connected to a second end of the sleeve; the first fixing part is fixedly connected to the sleeve; and the display panel is not contacted with the first supporting component and the second supporting component; and the rotating shaft is in an interference fit with the sleeve, and the rotating shaft is rotated under an external force to drive the sleeve connected thereto to rotate, thereby unfolding or folding the display panel.

In some embodiments, the display device further includes: a driving component, which is connected to the rotating shaft and used for driving the rotating shaft to rotate, thereby unfolding or folding the display panel.

In some embodiments, the sleeve is provided as a power supplying component, which is electrically coupled to the driving component and the display panel for supplying power to the driving component and the display panel.

In some embodiments, the power supplying component is further provided with switch units comprising a first switch unit, a second switch unit, and a third switch unit, and the first switch unit, the second switch unit, and the third switch unit are used for controlling unfolding and folding of the display panel and supplying power to the display panel.

In some embodiments, the display device further includes: a heat dissipation component, which is on a surface of the power supplying component and used for dissipating heat generated by the power supplying component.

In some embodiments, the heat dissipation component includes: a heat dissipation channel on the surface of the power supplying component; and at least one heat dissipation member uniformly distributed on a surface of the heat dissipation channel.

In some embodiments, a shape of each of the at least one heat dissipation member comprises a rectangle, and a side of the heat dissipation member distal to the heat dissipation channel has a spherical structure.

In some embodiments, a material of the heat dissipation component comprises graphene or carbon fiber.

In some embodiments, the display device further includes: a fixing shaft and a connecting component; and the fixing shaft is connected to the rotating shaft via the connecting component and used for being handheld.

In some embodiments, the display device further includes: a cleaning component, which is fixed on the fixing shaft and used for keeping the surface of the display panel clean when the display panel is being folded.

In some embodiments, a material of the cleaning component comprises a conductive fiber.

In some embodiments, both of the first supporting component and the second supporting component have a silk-thread structure.

In some embodiments, a material of each of the first supporting component and the second supporting component comprises polyetheretherketone.

DETAILED DESCRIPTION

In order to make those skilled in the art to better understand the solutions of the present disclosure, the present disclosure will be further described in detail with respect to accompanying drawings and embodiments.

Terms such as "first", "second", and the like used in embodiments of the present disclosure do not denote any order, quantity, or importance, but to distinguish one element from another. The word such as "include", "comprise", or the like, means that the element or item preceding the word, covers the element or item listed after the word and equivalents thereof, but does not exclude additional elements or items. Terms such as "left", "right", and the like are used only for indicating relative positional relationships in the drawings, and when the absolute position of the object being described is changed, the relative positional relationships may also change accordingly.

Figure 1:
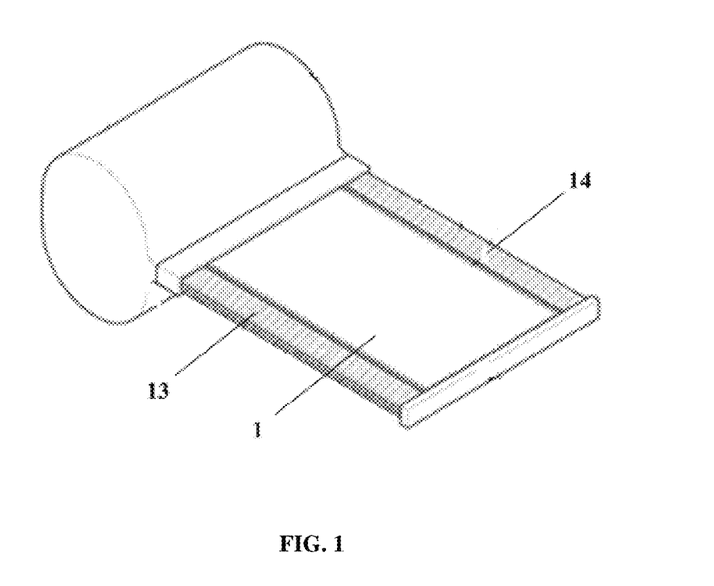
FIG. 1 is a schematic diagram of a structure of a display device in the related art.

As shown in FIG. 1, both sides of the flexible display screen in the related art each are provided with a frame to support the flexible display screen when the flexible display screen is in an unfold state, so as to avoid wrinkle of the flexible display screen and influence on display effect of the flexible display screen. However, as shown in FIG. 1, a left frame 13 and a right frame 14 respectively provided at opposite sides of the flexible display screen occupy part of the flexible display screen, arrangement of which reduces display area of the flexible display screen, thereby affecting the visual experience effect of a user using a display device made of the flexible display screen and reducing the user experience.

Figure 2:
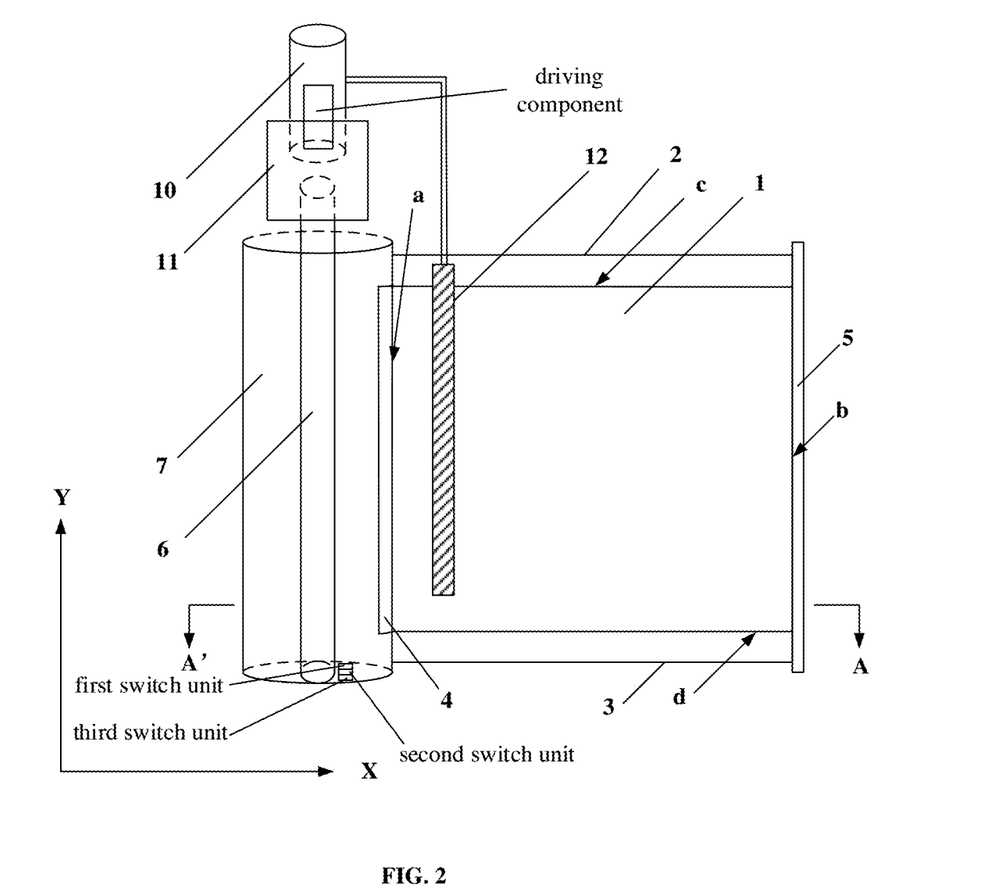
FIG. 2 is a schematic diagram of a structure of a display device according to an embodiment of the present disclosure.
Figure 2A:
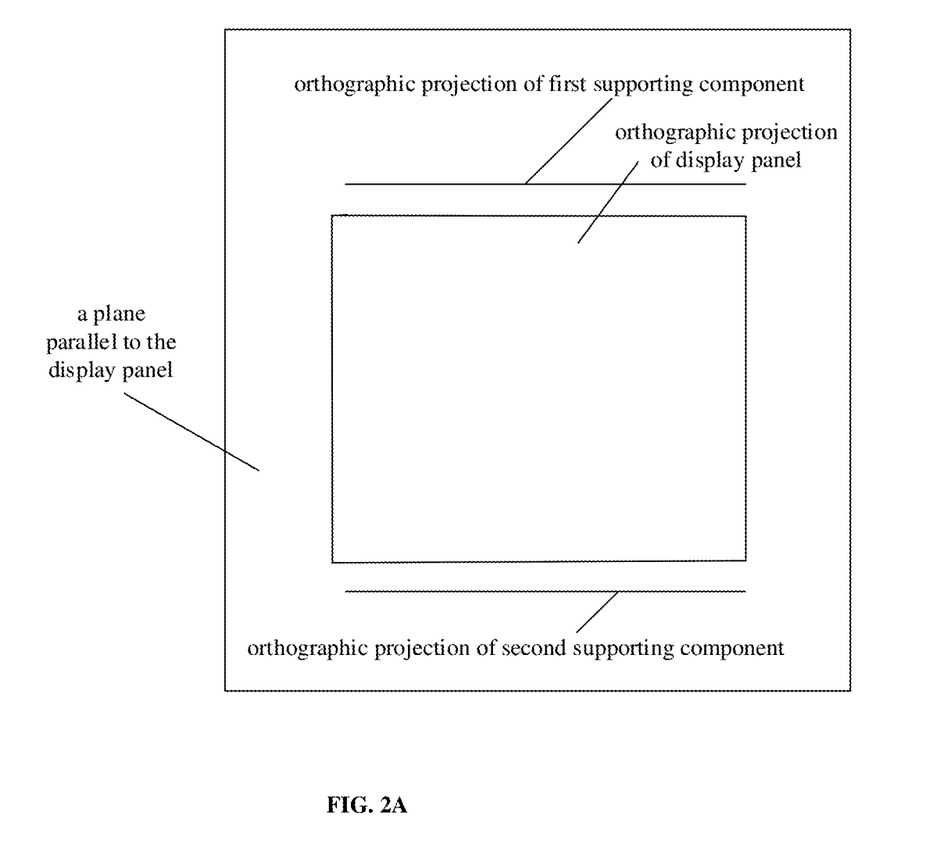
FIG. 2A is a schematic diagram of an orthographic projection of the first supporting component, an orthographic projection of the second supporting component, and an orthographic projection of the display panel on a plane parallel to the display panel.
Figure 2B:
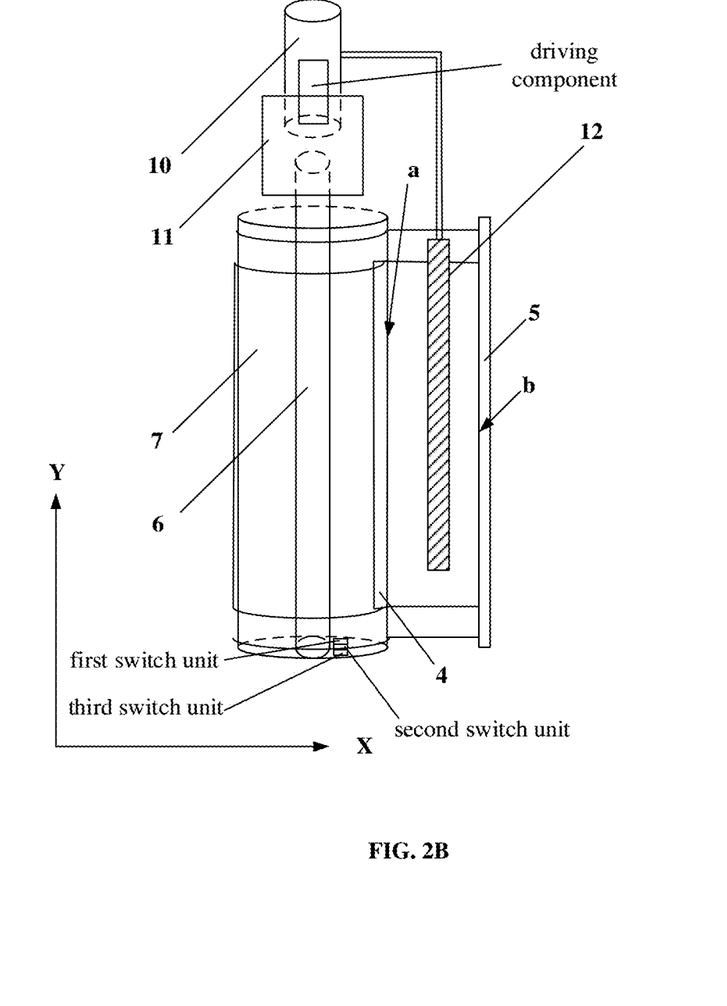
FIG. 2B is a schematic diagram of a display device according to an embodiment of the present disclosure in a folding state.

In an embodiment of the present disclosure, a display panel 1 is an example of a flexible display panel. The flexible display panel has a first side (side a shown in FIG. 2), a second side (side b shown in FIG. 2), a third side (side c shown in FIG. 2), and a fourth side (side d shown in FIG. 2). According to an embodiment of the present disclosure, as shown in FIG. 2, a display device is provided, and the display device includes: a flexible display panel, a pair of supporting components, a rotating component, a first fixing part and a second fixing part. The first fixing part is on the rotating component. The flexible display panel includes: a first side and a second side which are opposite to each other. The first side is fixedly connected to the first fixing part. The pair of supporting components includes: a first supporting component 2 and a second supporting component 3 which are opposite to each other. A first end of the first supporting component 2 is fixedly connected to a first end of the rotating component, and a second end of the first supporting component 2 is fixedly connected to a first end of the second fixing part on the second side. A first end of the second supporting component 3 is fixedly connected to a second end of the rotating component, and a second end of the second supporting component 3 is fixedly connected to a second end of the second fixing part on the second side. The first supporting component 2 interacts with the second supporting component 3 for supporting the flexible display panel when the flexible display panel is in an unfolded state. The rotating component is rotated by an external force to drive the flexible display panel, the first supporting component 2 and the second supporting component 3 to move simultaneously, such that the flexible display panel may be folded or unfolded.

The display device in the embodiment includes a pair of supporting components, i.e., the first supporting component 2 and the second supporting component 3, two ends of the first supporting component 2 are respectively fixedly connected to the first end of the first fixing part and the first end of the second fixing part at the second side of the flexible display panel, and two ends of the second supporting component 3 are respectively fixedly connected to the second end of the first fixing part and the second end of the second fixing part at the second side of the flexible display panel, and thus the first supporting component 2 interacts with the second supporting component 3 for supporting the flexible display panel when the flexible display panel with easy deformation and no rigidity is being unfolded, such that the flexible display panel is in an unfolded and flat state in a direction perpendicular to the first side (an x-direction as shown in FIG. 2) so as to avoid wrinkle of the flexible display panel and to ensure better display of the flexible display panel.

According to an embodiment of the present disclosure, as shown in FIG. 2, a display device is further provided, and the display device includes: a flexible display panel, a pair of supporting components, a rotating shaft 6, a sleeve 7, a first fixing part 4 and a second fixing part 5. Specifically, the flexible display panel includes: a first side and a second side which are opposite to each other. The first fixing part 4 is fixed to the first side of the flexible display panel, and the second fixing part 5 is fixed to the second side of the flexible display panel; and the first fixing part 4 is fixed at an intermediate position of the sleeve 7. The pair of supporting components includes: a first supporting component 2 and a second supporting component 3 which are opposite to each other. A first end of the first supporting component 2 is fixedly connected to a first end of the sleeve 7, and a second end of the first supporting component 2 is fixedly connected to a first end of the second fixing part 5 on the second side. A first end of the second supporting component 3 is fixedly connected to a second end of the sleeve 7, and a second end of the second supporting component 3 is fixedly connected to a second end of the second fixing part 5 on the second side. The first supporting component 2 and the second supporting component 3 interact with each other to support the flexible display panel when the flexible display panel is in an unfolded state, such that the flexible display panel is in an unfolded and flat state in a direction perpendicular to the first side (an x-direction as shown in FIG. 2) so as to ensure better display of the flexible display panel. An orthographic projection of the first supporting component 2 and an orthographic projection of the second supporting component 3 on a plane parallel to the display panel do not overlap that of the display panel 1 on the plane parallel to the display panel. Meanwhile, the first side of the flexible display panel is fixedly connected to the sleeve 7 via the first fixing part 4, and the flexible display panel is not in contact with the first supporting component 2 and the second supporting component 3. That is, the first side of the flexible display panel is fixed at an intermediate position of the sleeve 7, and the intermediate position specifically refers to a position between a first end of the sleeve 7 and a second end of the sleeve 7. An interference fit is formed between the rotating shaft 6 and the sleeve 7, that is, the sleeve 7 is fixed on the rotating shaft 6. The rotating shaft 6 is rotated under an external force to drive the sleeve 7 connected thereto to rotate, so as to drive the flexible display panel, the first supporting component 2 and the second supporting component 3 to move simultaneously, thereby folding or unfolding the flexible display panel.

The display device in the embodiment includes a pair of supporting components, which may interact with each other to support the display panel 1 when the display panel 1 is in an unfolded state, and the orthographic projection of the pair of supporting components on a plane parallel to the display panel does not overlap the orthographic projection of the display panel 1 on the plane parallel to the display panel. As shown in FIG. 2, the pair of supporting components in the embodiment are respectively arranged at the third side and the fourth side of the display panel 1 and are not in contact with the display panel 1, that is, both of the pair of supporting components do not occupy any area of the display panel 1, such that the left frame 13 and the right frame 14, which are respectively on the third side and the fourth side of the display panel 1 to support the display panel 1 in the related art, are omitted, and a narrow bezel of the display panel 1 is realized, a proportion of the display area of the display panel 1 to the whole display panel 1 is increased. That is, the display area is increased, and visual experience effect of a user using a display devise made of the display panel 1 and user experience are improved. Further, the flexible display panel in an unfolded state is enabled to be in a flat state in a direction parallel to the first side (e.g., a direction y shown in FIG. 2), thereby ensuring the flexible display panel to display better.

Specifically, for the purpose of facilitating understanding of the present embodiment, an operating principle of the display device in the present embodiment will be specifically described below.

When the rotating shaft 6 is rotated under an external force along a clockwise, the sleeve 7, which is in the interference fit with the rotating shaft 6, is also rotated along the clockwise following the rotating shaft 6. Meanwhile, since the first side of the flexible display panel is fixed to the first fixing part 4 and accordingly fixed to the sleeve 7, and the first ends of the first supporting component 2 and the second supporting component 3 are fixed to the first end and the second end of sleeve 7 respectively, all the three of the flexible display panel, the first supporting component 2 and the second supporting component 3 may wind along the surface of the sleeve 7 simultaneously to fold the flexible display panel. Similarly, when the rotating shaft 6 is rotated under an external force along a counter-clockwise, the sleeve 7, which is in the interference fit with the rotating shaft 6, is also rotated along the counter-clockwise following the rotating shaft 6. Meanwhile, the flexible display panel, the first supporting component 2 and the second supporting component 3, which are wound along the surface of the sleeve 7, may stretch out from the surface of the sleeve 7 simultaneously to make the flexible display panel be in an unfolded state.

When the rotating shaft 6 is rotated under an external force along a clockwise, the rotating shaft 6 may also drive the flexible display panel, the first supporting component 2, and the second supporting component 3 which are wound along the sleeve 7, to simultaneously stretch out of the surface of the sleeve 7, so as to unfold the flexible display panel. Similarly, when the rotating shaft 6 is rotated under an external force along a counter-clockwise, the rotating shaft 6 may also drive all the three of the flexible display panel, the first supporting component 2, and the second supporting component 3 to simultaneously wind along the sleeve 7, so as to fold the flexible display panel. However, the present disclosure is not limited thereto.

In order to facilitate winding the first supporting component 2 and the second supporting component 3 around the sleeve 7 in the embodiment, the first supporting component 2 and the second supporting component 3 may be selected to have a silk-thread structure.

Since a material of each of the first supporting component 2 and the second supporting component 3 includes polyether ether ketone, the first supporting component 2 and the second supporting component 3 have strong flexibility and rigidity, such that the first supporting component 2 and the second supporting component 3 may not only wind at both ends of the sleeve 7, but also enable the flexible display panel to be in an flat state during the flexible display panel is being unfolded, by supporting both ends of the first side of the flexible display panel, thereby avoiding wrinkle and even tearing damage, which decreases the display effect of the flexible display screen, of the flexible display panel during being unfolded.

The external force in the embodiment may be a force manually applied to the rotating shaft 6, and the external force may alternatively be a driving force applied to the rotating shaft 6 by a driving component, such as a driving force generated by a motor driving the rotating shaft 6 to rotate. In order to enable the flexible display panel to stably stretch out from the surface of the sleeve 7 or to be wound around the surface of the sleeve 7 at a uniform speed, a driving force applied to the rotating shaft 6 by the driving component, as an external force, is taken as an example. Specifically, the display device in the embodiment is further provided with a driving component, which is connected to the rotating shaft 6 through a coupler and is used for driving the rotating shaft 6 to rotate, so as to automatically unfold or fold the flexible display panel.

Further, in the embodiment, the sleeve 7 may be provided as a power supplying component, which is electrically coupled to the driving component and the flexible display panel for supplying power thereto. Furthermore, in the embodiment, the display device may further be provided with switch units, which includes a first switch unit, a second switch unit, and a third switch unit; and all the three of the first switch unit, the second switch unit, and the third switch unit are coupled to the power supplying component. Specifically, when the first switch unit is turned on, the power supplying component supplies power to the driving component, such that the driving component may drive the rotating shaft 6 to rotate in a clockwise for folding the flexible display panel; when the first switch unit is turned off, the power supplying component no longer supplies power to the driving component, and at this time, the driving component stops driving the rotating shaft 6 to rotate. When the second switch unit is turned on, the power supplying component supplies power to the driving component, such that the driving component drives the rotating shaft 6 to rotate along a counter-clockwise to unfold the flexible display panel;

when the second switch unit is turned off, the power supplying component no longer supplies power to the driving component, and at this time, the driving component stops driving the rotating shaft 6 to rotate. When the third switch unit is turned on, the power supplying component supplies power to the flexible display panel, such that the flexible display panel displays a picture; and when the third switch unit is turned off, the power supplying component stops supplying power to the flexible display panel, and at the moment, the flexible display panel stops displaying a picture.

In order to prevent the power supplying component from being burned out due to overheating generated during an long-term operation, optionally, the display device in the embodiment further includes: a heat dissipation component on the surface of the power supplying component and used for dissipating heat generated by the power supplying component. A material of the heat dissipation component includes graphene or carbon fiber. The heat dissipation component may also be made of any other material, which is not limited thereto.

Figure 3:
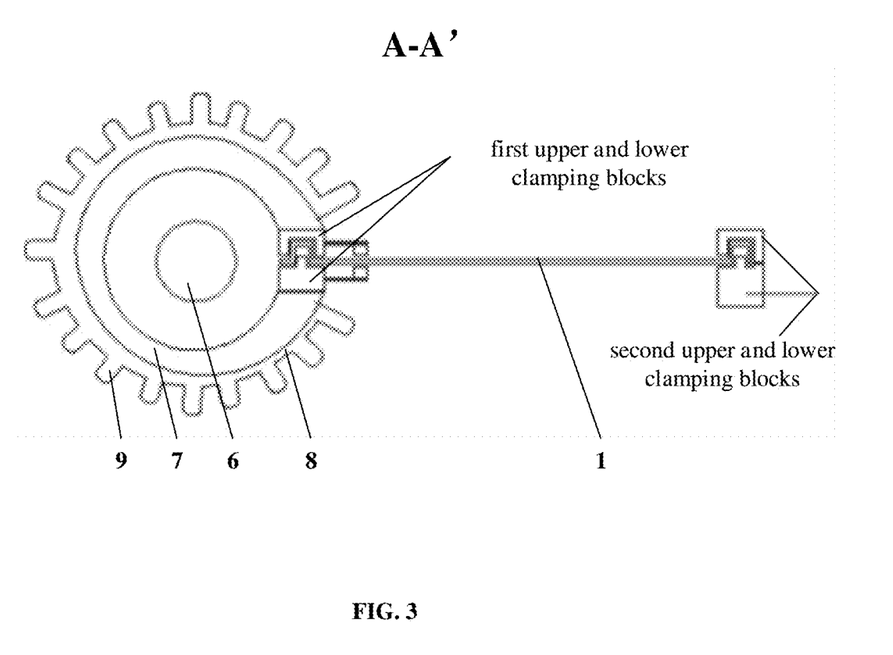
FIG. 3 is a schematic diagram of a cross-section of a heat dissipation component along A-A' according to an embodiment of the present disclosure.

Further, as shown in FIG. 3, the first fixing part and the second fixing part are fixedly connected to the flexible display panel through first upper and lower clamping blocks and second upper and lower clamping blocks, respectively, and the first and/or second upper and lower clamping blocks clamp and fix the flexible display panel in a snap-fit connection. The second fixing part also locks the upper clamping block and the lower clamping block by fastening bolts, and the locking degree of the second fixing part is adjustable. The heat dissipating component includes: a heat dissipating channel 8 provided on the surface of the power supplying component, and a plurality of heat dissipating members 9 evenly distributed on the surface of the heat dissipating channel 8. This structure can speed up the heat dissipation rate of dissipating the heat generated by the power supplying component to increase life and safety performance of the display device.

Furthermore, each heat dissipation member 9 has a shape of rectangle, and one side of the heat dissipation member 9 distal to the heat dissipation channel 8 has a spherical structure, which can effectively prevent the heat dissipation member 9 from scratching the flexible display panel.

Optionally, in the embodiment, the display device is further provided with a fixing shaft 10 and a connecting component 11. The fixing shaft 10 is connected to the rotating shaft 6 through the connecting component 11, and the fixing shaft 10 is used for driving the rotating shaft to rotate by being handheld. In the embodiment, the display device provided by this embodiment can be conveniently taken by a user through the fixing shaft 10, so as to avoid wrinkling or even tearing damage due to a hand touching the flexible display panel, thereby influencing display effect of the flexible display panel.

The flexible display panel will be in an unfolded state when a user uses the display device provided in the embodiment for a long time. During this period, inevitably, some foreign matters may adhere to the surface of the flexible display panel, and these foreign matters are likely to be wound along the sleeve 7 along with the flexible display panel when the flexible display panel is being folded. At this moment, some foreign sharp matters are likely to scratch the flexible display panel, thus affecting the display effect of the flexible display panel, and more seriously, may make the flexible display panel unable to display. In order to avoid the emergence of aforementioned condition, optionally, the display device in an embodiment still includes: a cleaning component 12 fixed on the fixing shaft 10 and used for removing foreign matters adhered to the surface of the flexible display panel when the flexible display panel is being folded, so that the surface of the flexible display panel is kept clean.

Further, static electricity due to friction between the surface of the flexible display panel and the cleaning component 12 when the foreign matters adhered to the surface of the flexible display panel are removed by the cleaning component 12, may damage the flexible display panel, and thus the cleaning component 12 may be made of an anti-electrostatic material, such as a conductive fiber.

In summary, the first supporting component 2 and the second supporting component 3 are respectively on the third side and the fourth side of the flexible display panel in the embodiment and both are not in contact with the flexible display panel, i.e. the first supporting component 2 and the second supporting component 3 do not occupy any area on the display panel and interact with each other, such that the left frame 13 and the right frame 14 respectively on the third side and the fourth side of the display panel 1 to support the display panel 1 in the related art are omitted, a narrow bezel of the display panel 1 is realized, and a proportion of the display area of the display panel 1 to the whole display panel 1 is increased. That is, the display area is increased, and visual experience effect of a user using a display device made of the display panel 1 and user experience are improved. Meanwhile, the display device in the embodiment further includes the driving component capable of automatically folding or unfolding the flexible display panel, the heat dissipation component for dissipating heat from the surface of the power supplying component, and the cleaning component 12 for keeping the surface of the flexible display panel clean, which may cooperate to improve the service life, safety performance and even market competitiveness of the display device provided in the embodiment.

It should be understood that the above embodiments are merely exemplary embodiments for explaining the principle of the present disclosure, and the present disclosure is not limited thereto. It will be apparent to one of ordinary skill in the art that various changes and modifications may be made thereto without departing from the spirit and essence of the present disclosure, and these changes and modifications also fall within the scope of the present disclosure.

What is claimed is:

1. A display device, comprising: a display panel, a pair of supporting components, a rotating component, a first fixing part and a second fixing part; wherein
the first fixing part is fixedly connected to the rotating component;
the display panel comprises: a first side and a second side which are opposite to each other, and
the first side is fixedly connected to the first fixing part, and the second side is fixedly connected to the second fixing part;
the pair of supporting components comprises: a first supporting component and a second supporting component which are opposite to each other; a first end of the first supporting component is fixedly connected to a first end of the rotating component, and a second end of the first supporting component is fixedly connected to a first end of the second fixing part at the second side of the display panel; a first end of the second supporting component is fixedly connected to a second end of the rotating component, and a second end of the second supporting component is fixedly connected to a second end of the second fixing part at the second side of the display panel; and the first supporting component interacts with the second supporting component for supporting the display panel when the display panel is in an unfolded state; and the rotating component is rotated under an external force to drive the display panel, the first supporting component and the second supporting component to move simultaneously, thereby folding or unfolding the display panel, wherein the rotating component comprises a rotating shaft and a sleeve;

wherein the display device further comprises a driving component, which is connected to the rotating shaft and used for driving the rotating shaft to rotate, thereby unfolding or folding the display panel; and wherein the sleeve is provided as a power supplying component, which is electrically coupled to the driving component and the display panel for supplying power to the driving component and the display panel.

2. The display device of claim 1, wherein an orthographic projection of the first supporting component and an orthographic projection of the second supporting component on a plane parallel to the display panel do not overlap an orthographic projection of the display panel on the plane parallel to the display panel.

3. The display device of claim 1, wherein the first side of the display panel is fixedly connected to the first fixing part by first upper and lower clamping blocks, and the second side of the display panel is fixedly connected to the second fixing part by second upper and lower clamping blocks.

4. The display device of claim 1, wherein
the first end of the first supporting component is fixedly connected to a first end of the sleeve;
the first end of the second supporting component is fixedly connected to a second end of the sleeve; the first fixing part is fixedly connected to the sleeve; and the display panel is not abutted with the first supporting component and the second supporting component; and
an interference fit is formed between the rotating shaft and the sleeve, and the rotating shaft is rotated under the external force to drive the sleeve connected thereto to rotate, thereby unfolding or folding the display panel.

5. The display device of claim 4, wherein the display device further comprises: a fixing shaft and a connecting component; and the fixing shaft is connected to the rotating shaft via the connecting component and used for being handheld.

6. The display device of claim 5, wherein the display device further comprises: a cleaning component, which is fixed on the fixing shaft and used for keeping the surface of the display panel clean when the display panel is being folded.

7. The display device of claim 6, wherein a material of the cleaning component comprises a conductive fiber.

8. The display device of claim 1, wherein the power supplying component is further provided with switch units comprising a first switch unit, a second switch unit, and a third switch unit, and
the first switch unit, the second switch unit, and the third switch unit are used for controlling unfolding and folding of the display panel and supplying power to the display panel.

9. The display device of claim 1, wherein the display device further comprises: a heat dissipation component, which is on a surface of the power supplying component and used for dissipating heat generated by the power supplying component.

10. The display device of claim 9, wherein the heat dissipation component comprises:
a heat dissipation channel on the surface of the power supplying component; and
at least one heat dissipation member uniformly distributed on a surface of the heat dissipation channel.

11. The display device of claim 10, wherein a shape of each of the at least one heat dissipation member comprises a rectangle, and a side of the heat dissipation member distal to the heat dissipation channel has a semispherical structure.

12. The display device of claim 9, wherein a material of the heat dissipation component comprises graphene or carbon fiber.

13. The display device of claim 1, wherein both of the first supporting component and the second supporting component have a silk-thread structure.

14. The display device of claim 1, wherein a material of each of the first supporting component and the second supporting component comprises polyetheretherketone.

* * * * *